(12) United States Patent
Nieh et al.

(10) Patent No.: US 10,848,084 B2
(45) Date of Patent: Nov. 24, 2020

(54) BRUSHLESS DC MOTOR CONTROL UNIT

(71) Applicants: DEFOND ELECTECH CO., LTD., Guangdong (CN); Defond Components Limited, Chai Wan (CN)

(72) Inventors: Cheng Chen Nieh, Hong Kong (CN); Wai Man Wong, Hong Kong (CN); Ming Leong Kong, Hong Kong (CN); Pat On Kwok, Hong Kong (CN)

(73) Assignees: Defond Electech Co., Ltd., Guangdong (CN); Defond Components Limited, Chai Wan (HK)

( * ) Notice: Subject to any disclaimer, the term of this patent is extended or adjusted under 35 U.S.C. 154(b) by 0 days.

(21) Appl. No.: 16/101,408

(22) Filed: Aug. 11, 2018

(65) Prior Publication Data

US 2019/0089277 A1 Mar. 21, 2019

(30) Foreign Application Priority Data

Sep. 15, 2017 (HK) .................................. 17109412.2

(51) Int. Cl.
*H02P 7/29* (2016.01)
*H02P 1/18* (2006.01)
(Continued)

(52) U.S. Cl.
CPC .................. *H02P 7/29* (2013.01); *B25F 5/00* (2013.01); *H01H 13/12* (2013.01); *H02P 1/18* (2013.01);
(Continued)

(58) Field of Classification Search
CPC ...... H02P 7/29; H02P 1/18; H02P 6/08; B25F 5/00; H01H 13/12
(Continued)

(56) References Cited

U.S. PATENT DOCUMENTS

| 4,348,603 A | 9/1982 | Huber |
| 2007/0126407 A1 | 6/2007 | Loong |

(Continued)

FOREIGN PATENT DOCUMENTS

| CN | 101256910 A | 9/2008 |
| CN | 102751117 A | 10/2012 |

(Continued)

OTHER PUBLICATIONS

Bonnin, David, Examiner, European Patent Office, "Extended European Search Report" in connection with related European Patent Application No. 18191643.8, dated Jun. 21, 2019, 10 pgs.

*Primary Examiner* — Kawing Chan
(74) *Attorney, Agent, or Firm* — Kolisch Hartwell, P.C.

(57) ABSTRACT

An electrical switch unit for use with an electrical device to control operation of a DC motor of the electrical device, the electrical switch unit comprising: a housing which houses a pair of electrical switching contacts, and, an actuator operably connected with at least one of the pair of electrical switching contacts, the actuator being configured for movement relative to the pair of electrical switching contacts so as to arrange the pair of electrical switching contacts into at least one of a closed configuration wherein power is able to be supplied from the DC power source to the DC motor via the pair of electrical switching contacts, and, an opened configuration wherein power is not able to be supplied from the DC power source to the DC motor via the pair of electrical switching contacts; a signaling module associated with the electrical switch unit comprising signaling circuitry for sensing the movement of the actuator and outputting a signaling module signal indicative of the sensed movement or position of the actuator; a power module comprising at least one power switching device for controllably supplying power from the DC power source to the DC motor; a control module comprising control circuitry for receiving the sig- (Continued)

naling module signal, and responsive to the received signaling module signal, outputting a control module signal to control the at least one power switching transistor device of the power module wherein the at least one power switching device controllably supplies power from the DC power source to the DC motor to allow operation of the DC motor at a speed corresponding to the sensed movement or position of the actuator; and wherein, the signaling module is integrally connected to a first end of the control module that is located within the electrical switch unit housing to allow relatively direct electrical communication between the pair of electrical switching contacts and the control module, and, whereby the control module is configured to extend outwardly of the electrical switch housing so as to terminate at a distal second end.

15 Claims, 13 Drawing Sheets

(51) Int. Cl.
| | |
|---|---|
| H03K 17/0412 | (2006.01) |
| H03K 17/687 | (2006.01) |
| B25F 5/00 | (2006.01) |
| H01H 13/12 | (2006.01) |
| H02P 6/08 | (2016.01) |
| H01H 9/02 | (2006.01) |

(52) U.S. Cl.
CPC ......... *H02P 6/08* (2013.01); *H03K 17/04123* (2013.01); *H03K 17/687* (2013.01); *B25F 5/001* (2013.01); *H01H 9/0214* (2013.01)

(58) Field of Classification Search
USPC .......................................................... 388/816
See application file for complete search history.

(56) References Cited

U.S. PATENT DOCUMENTS

| | | | | |
|---|---|---|---|---|
| 2011/0278033 | A1 | 11/2011 | Song et al. | |
| 2012/0293103 | A1* | 11/2012 | Forster | B25F 5/00 318/503 |
| 2013/0193891 | A1* | 8/2013 | Wood | B25F 5/00 318/434 |
| 2013/0313925 | A1 | 11/2013 | Mergener et al. | |
| 2014/0292245 | A1* | 10/2014 | Suzuki | H02P 23/0004 318/478 |
| 2015/0034348 | A1* | 2/2015 | Yoshida | B23Q 15/00 173/176 |
| 2015/0115857 | A1* | 4/2015 | Sergyeyenko | H02P 27/00 318/504 |
| 2015/0280517 | A1* | 10/2015 | Ekstrom | H01H 21/12 173/170 |
| 2018/0099391 | A1* | 4/2018 | Umemoto | B25D 11/005 |
| 2018/0219498 | A1* | 8/2018 | Iwata | B25F 5/00 |

FOREIGN PATENT DOCUMENTS

| | | |
|---|---|---|
| CN | 204658374 U | 9/2015 |
| EP | 2929986 A2 | 10/2015 |

* cited by examiner

BRUSHLESS DC MOTOR CONTROL UNIT

TECHNICAL FIELD

The present invention relates to electrical switch units for use with DC motors of electrical devices such as power tools, gardening tools and the like.

BACKGROUND OF THE INVENTION

Certain electrical devices such as electrical power tools and electrical gardening tools utilize brushless DC motors to convert input DC power into mechanical power in the form output torque or motion. Typically, the electrical device will include a variable speed trigger mechanism, electrical switch contacts to selectively connect and disconnect a DC power source to the DC motor in response to movement of an actuator of the variable speed trigger mechanism, motor signaling circuitry for communicating electrical signals indicative of the required speed of the DC motor responsive to movement of the actuator, as well as motor control circuitry comprising power switching devices for selectively activating stator winding inputs of the DC motor in response to signals received from the motor signaling circuitry so that the DC motor operates at the required speed. One of the problems associated with design of conventional power tools is in seeking to reduce the amount of space occupied by the various components so that such tools may be more compact for hand-held operation, and, easier and faster to assemble.

SUMMARY OF THE INVENTION

The present invention seeks to alleviate at least one of the above-described problems. The present invention may involve several broad forms. Embodiments of the present invention may include one or any combination of the different broad forms herein described.

In a first broad form, the present invention provides an electrical switch unit for use with an electrical device to control operation of a DC motor of the electrical device, the electrical switch unit comprising: a housing which houses a pair of electrical switching contacts, and, an actuator operably connected with at least one of the pair of electrical switching contacts, the actuator being configured for movement relative to the pair of electrical switching contacts so as to arrange the pair of electrical switching contacts into at least one of a closed configuration wherein power is able to be supplied from the DC power source to the DC motor via the pair of electrical switching contacts, and, an opened configuration wherein power is not able to be supplied from the DC power source to the DC motor via the pair of electrical switching contacts; a signaling module associated with the electrical switch unit comprising signaling circuitry for sensing the movement or position of the actuator and outputting a signaling module signal indicative of the sensed movement or position of the actuator; a power module comprising at least one power switching device for controllably supplying power from the DC power source to the DC motor; a control module comprising control circuitry for receiving the signaling module signal, and responsive to the received signaling module signal, outputting a control module signal to control the at least one power switching device of the power module wherein the at least one power switching device controllably supplies power from the DC power source to the DC motor to allow operation of the DC motor at a speed corresponding to the sensed movement or position of the actuator; and wherein, the signaling module is integrally connected to a first end of the control module that is located within the electrical switch unit housing to allow relatively direct electrical communication of the pair of electrical switching contacts and/or the signaling module with the control module, and, whereby the control module is configured to extend outwardly of the electrical switch housing so as to terminate at a distal second end.

Preferably, the DC motor may include a brushless DC motor.

Preferably, the at least one power switching device may include a MOSFET device.

Preferably, the present invention may include a protective resin coating for protecting components of at least one of the signaling module, the control module and the power module from harsh working and environmental conditions.

Preferably, the signaling module and the control module may be integrally formed together in a first PCB. Also, preferably, the power module may be formed in a second PCB.

Preferably, the first PCB and the second PCB may be arranged substantially perpendicularly to each other. Alternately, the first PCB and the second PCB may be arranged substantially spaced apart and parallel to each other.

Alternately, the signaling module, control module and the power module may be integrally formed together in a single PCB.

Preferably, the present invention may include a heat transfer element arranged in thermal communication with a bottom region of the power module to allow heat dissipation from out of the power module. Alternately, the present invention may include a first and second heat transfer element arranged in thermal communication with a bottom region and a top region of the power module respectively to allow heat transfer from the power module.

In a further broad form, the present invention provides a customisable electrical switch unit for use with an electrical device to control operation of a DC motor of the electrical device, the electrical switch unit comprising: a pair of electrical switching contacts, and, an actuator operably connected with at least one of the pair of electrical switching contacts, the actuator being configured for movement relative to the pair of electrical switching contacts so as to arrange the pair of electrical switching contacts into at least one of a closed configuration wherein power is able to be supplied from the DC power source to the DC motor via the pair of electrical switching contacts, and, an opened configuration wherein power is not able to be supplied from the DC power source to the DC motor via the pair of electrical switching contacts; a signaling module comprising signaling circuitry for sensing the movement of the actuator and outputting a signaling module signal indicative of the sensed movement or position of the actuator; and an electrical connection interface via which at least one of a control module and a power module are able to be selectably connected to the electrical switch unit for customised operation of the electrical switch unit, wherein said power module comprises at least one power switching device for controllably supplying power from the DC power source to the DC motor; and the control module comprises control circuitry for receiving the signaling module signal, and responsive to the received signaling module signal, outputting a control module signal to control the at least one power switching device of the power module wherein the at least one power switching device controllably supplies power from the DC power source to the DC motor to allow operation of the DC motor at a speed corresponding to the sensed movement or position of the actuator, and whereby the at least one of the control module and the power module are able to be integrally formed together with the pair of electrical switching contacts and/or together with the signaling module associated with the electrical switch unit for relatively direct electrical communication therebetween.

Preferably, the DC motor may include a brushless DC motor.

Preferably, the at least one power switching device may include at least one MOSFET device.

Preferably, the present invention may include a protective resin coating for protecting components of at least one of the signaling module, the control module and the power module.

Preferably, the signaling module may be formed on a first PCB and the power module may be formed on a separate second PCB. Also, preferably, the first PCB and the second PCB may be arranged substantially perpendicularly to each other when the power module is mounted to the electrical connector interface of the customisable electrical switch unit. Alternately, the first PCB and the second PCB may be arranged substantially spaced apart and parallel to each other when the power module is mounted to the electrical connector interface of the customisable electrical switch unit Alternately, the signaling module and the power module may be integrally formed together in a single PCB.

Preferably, the present invention may include a heat dissipation and/or heat dispersion element arranged in thermal communication with a bottom region of the power module to allow heat dissipation and/or dispersion from the power module. Alternately, the present invention may include a first and second heat dissipation and/or heat dispersion element arranged in thermal communication with a bottom region and a top region of the power module respectively to allow heat transfer from the power module.

In a third broad form, the present invention provides an electrical device comprising an electrical switch unit or a customisable electrical switch unit in accordance with any one of the preceding broad forms of the present invention.

Preferably, the electric device may include at least one of an electrical power tool and an electrical gardening tool.

BRIEF DESCRIPTION OF THE DRAWINGS

The present invention will become more fully understood from the following detailed description of a preferred but non-limiting embodiments thereof, described in connection with the accompanying drawings, wherein.

DETAILED DESCRIPTION OF THE PREFERRED EMBODIMENTS

Figure 1:
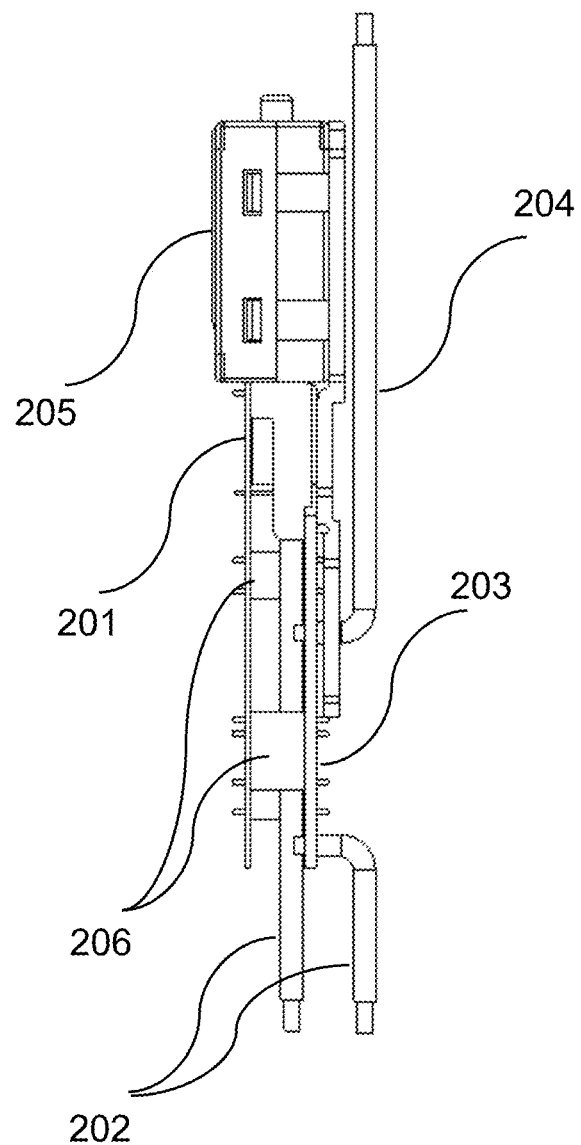
FIG. 1 shows a first side-view of an electrical switch unit with an integrated signaling module/control module PCB for controlling operation of a DC brushless motor of an electrical power tool, and a power module PCB mounted in parallel with the integrated signaling module/control module PCB, in accordance with the first embodiment of the present invention.
Figure 2:
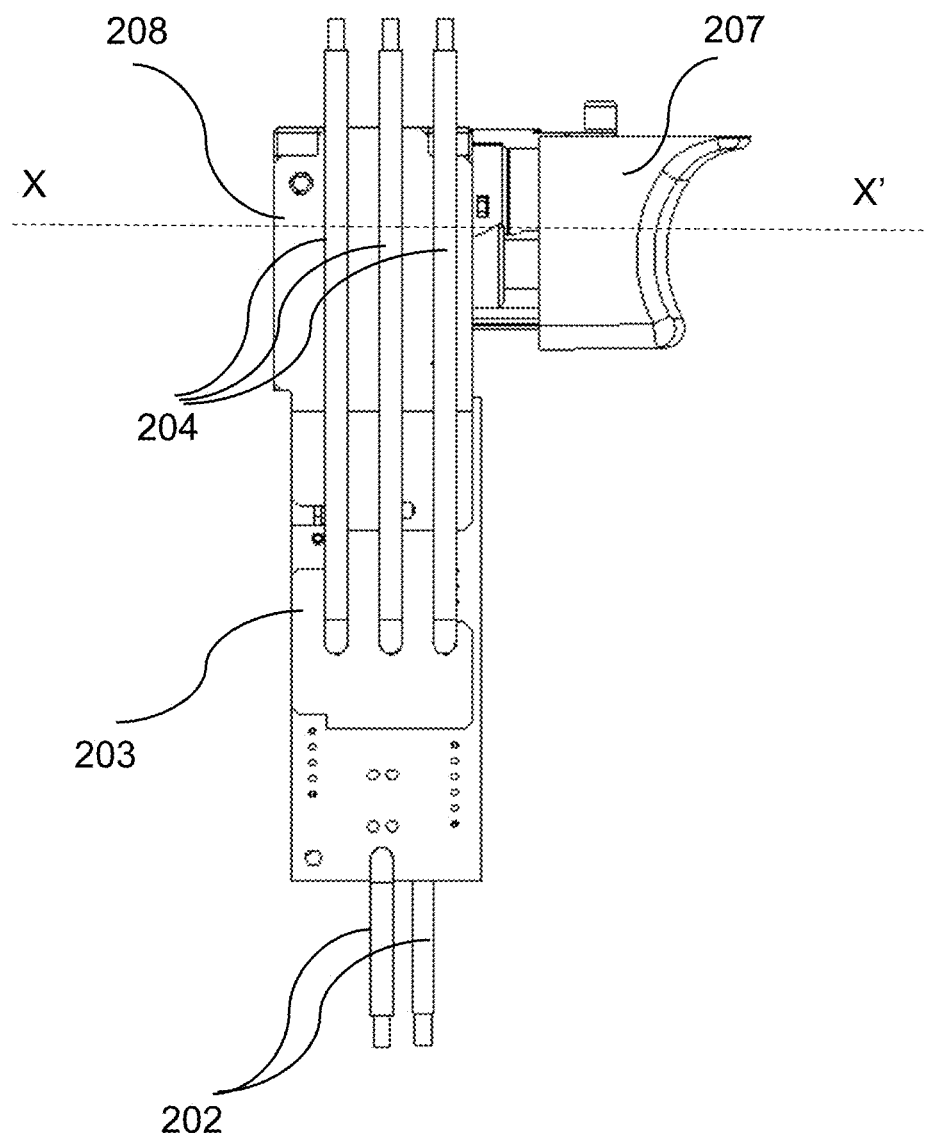
FIG. 2 shows a front view of the first embodiment electrical switch unit.
Figure 3:
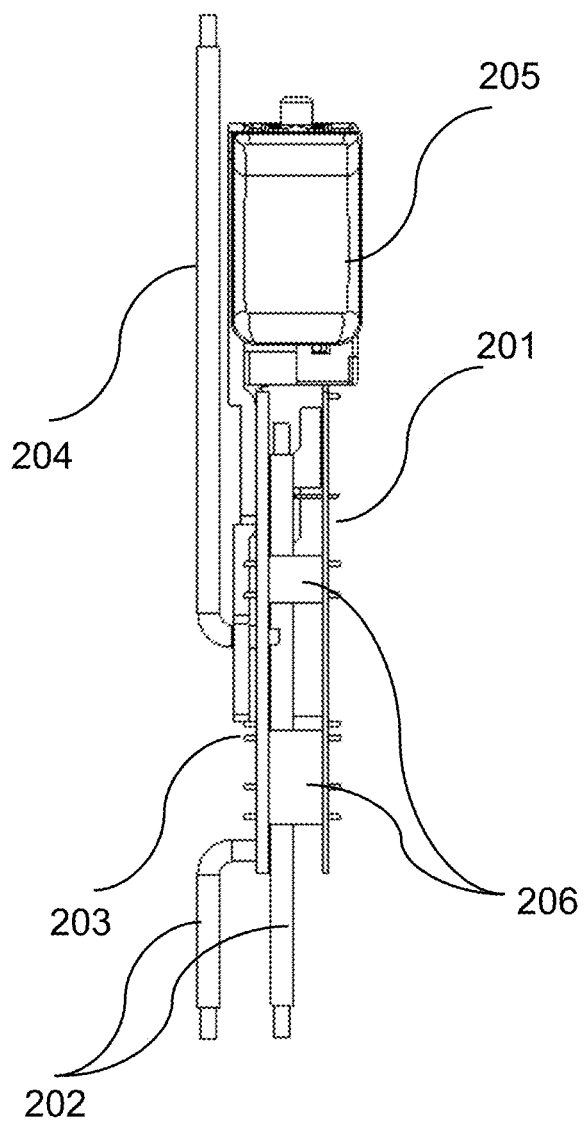
FIG. 3 shows a second side view of the first embodiment electrical switch unit.
Figure 4:
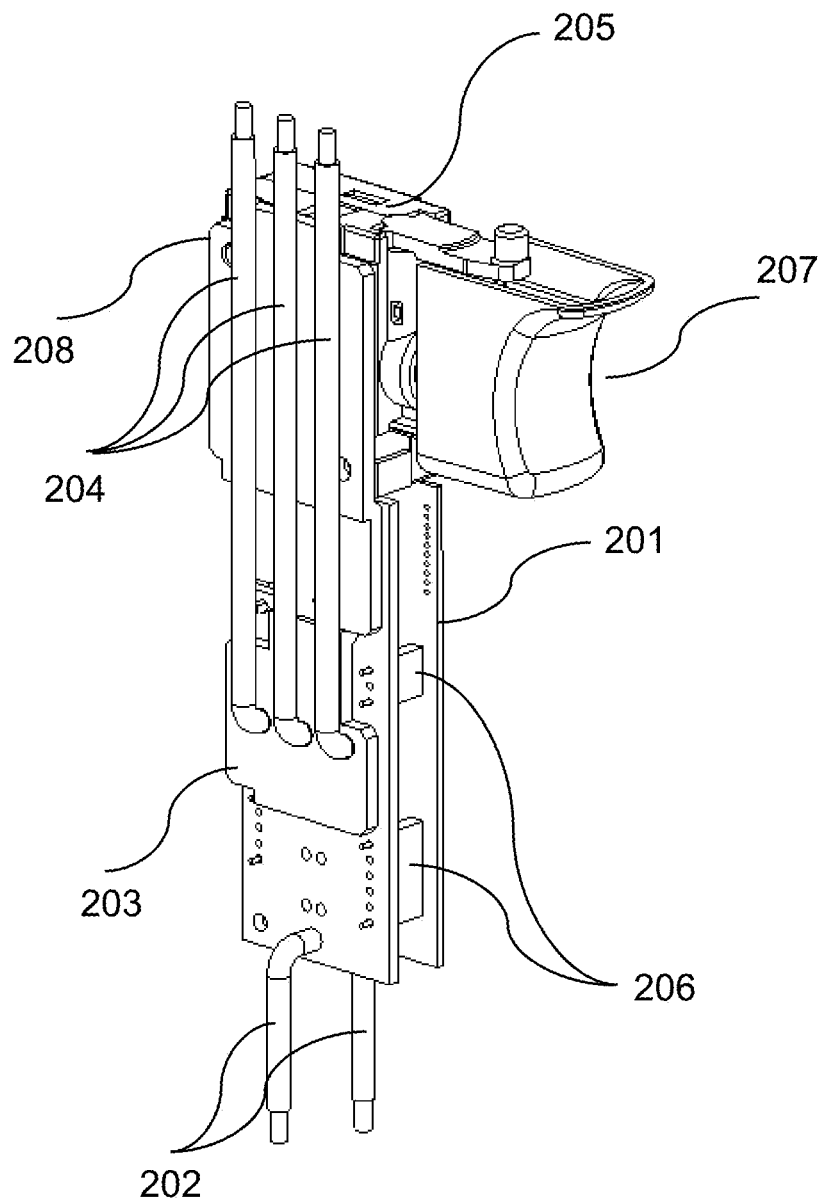
FIG. 4 shows a perspective view of the first embodiment electrical switch unit.
Figure 5:
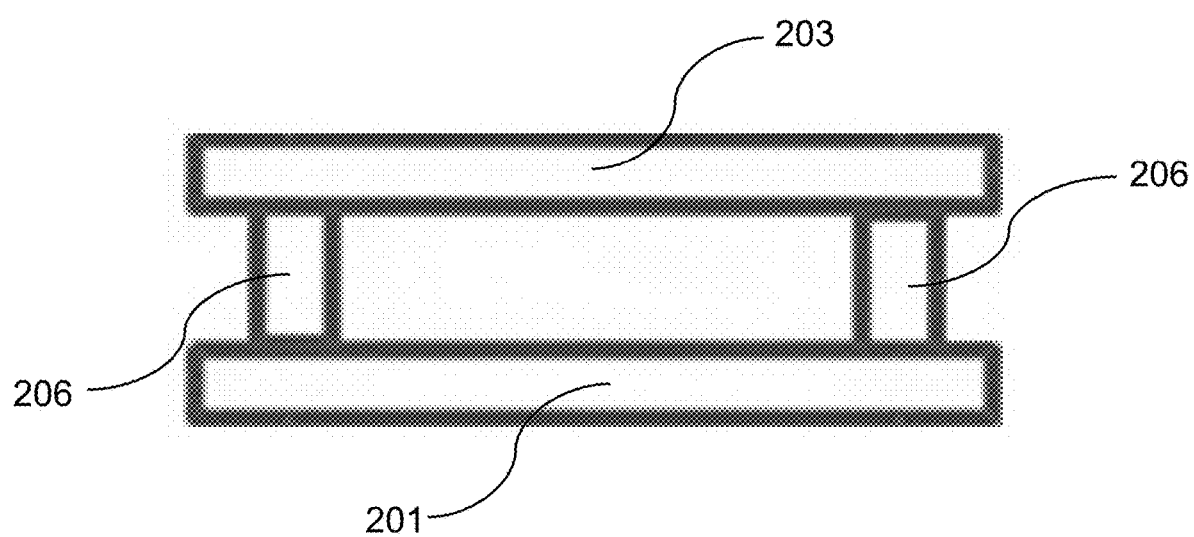
FIG. 5 shows a simplified representation of the integrated signaling module/control module PCB for controlling operation of a DC brushless motor of an electrical power tool in parallel with the power module PCB, in accordance with the first embodiment of the present invention.
Figure 6:
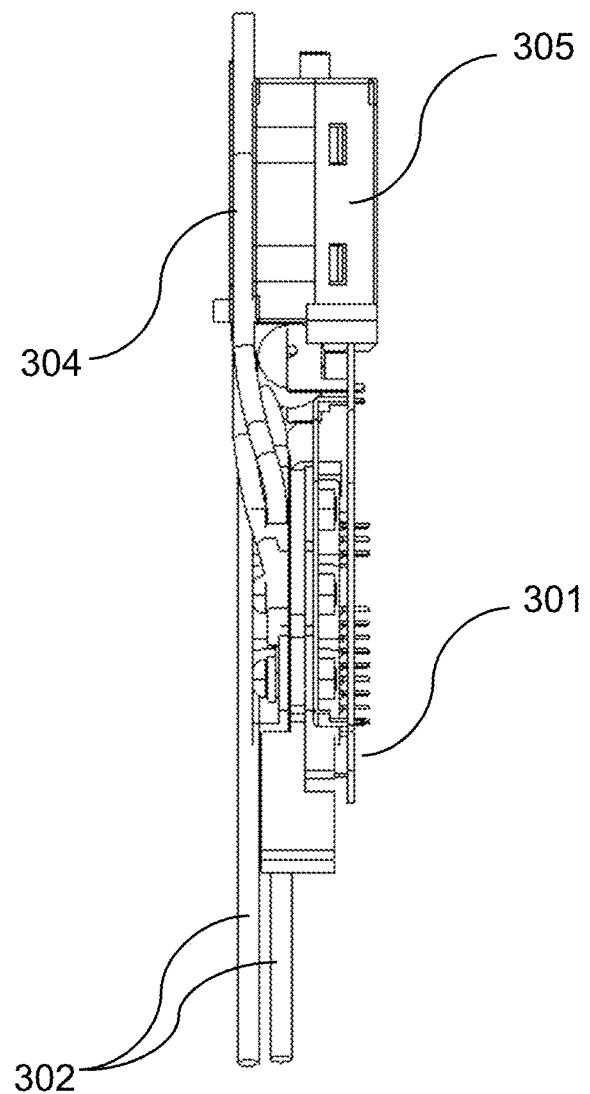
FIG. 6 shows a first side view of an electrical switch unit with an integrated signaling module/control module PCB for controlling operation of a DC brushless motor of an electrical power tool, and a power module PCB mounted perpendicularly with the integrated signaling module/control module PCB, in accordance with the second embodiment of the present invention.
Figure 7:
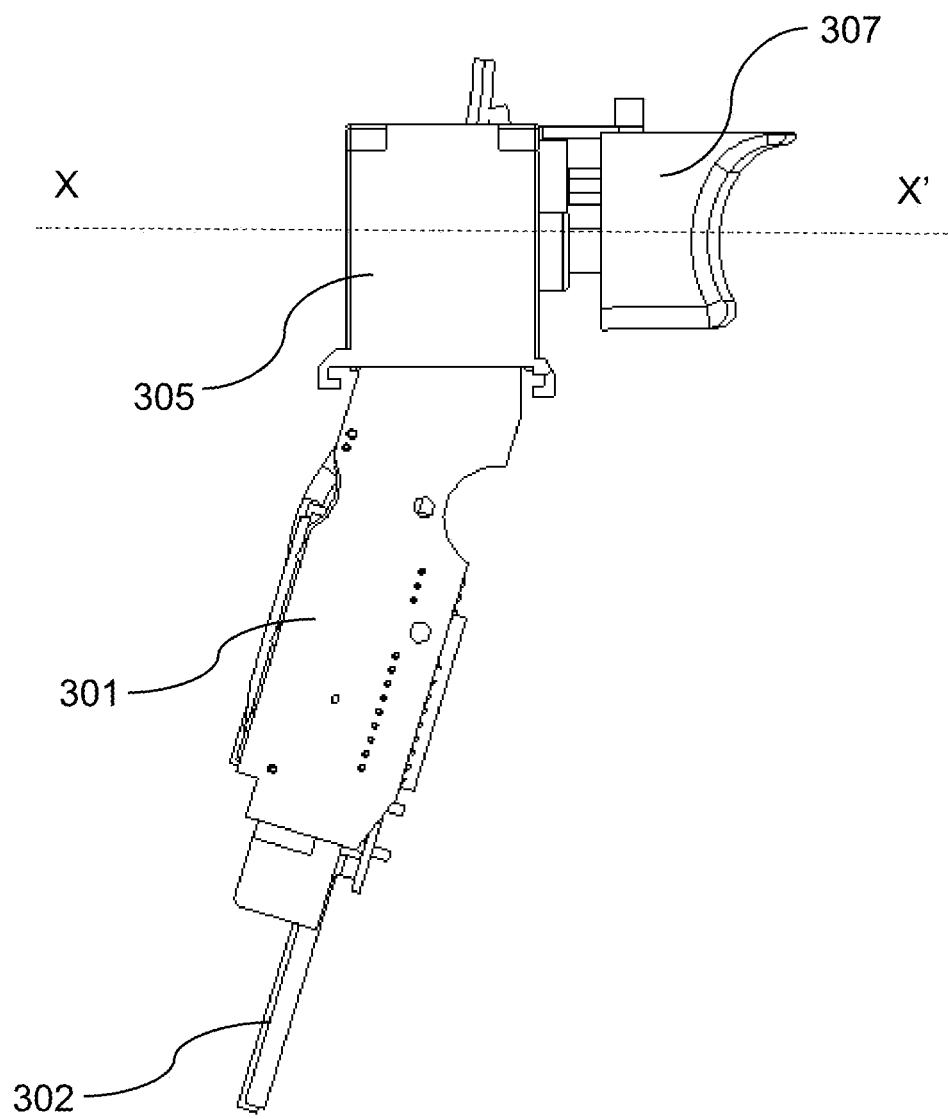
FIG. 7 shows a front view of the second embodiment electrical switch unit.
Figure 8:
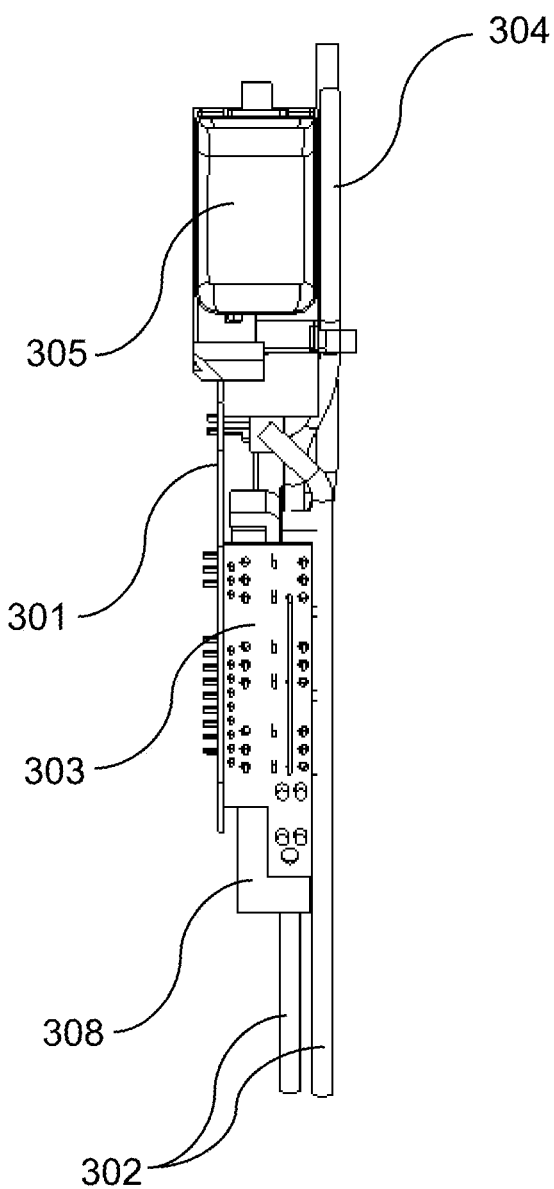
FIG. 8 shows a second side view of the second embodiment electrical switch unit.
Figure 9:
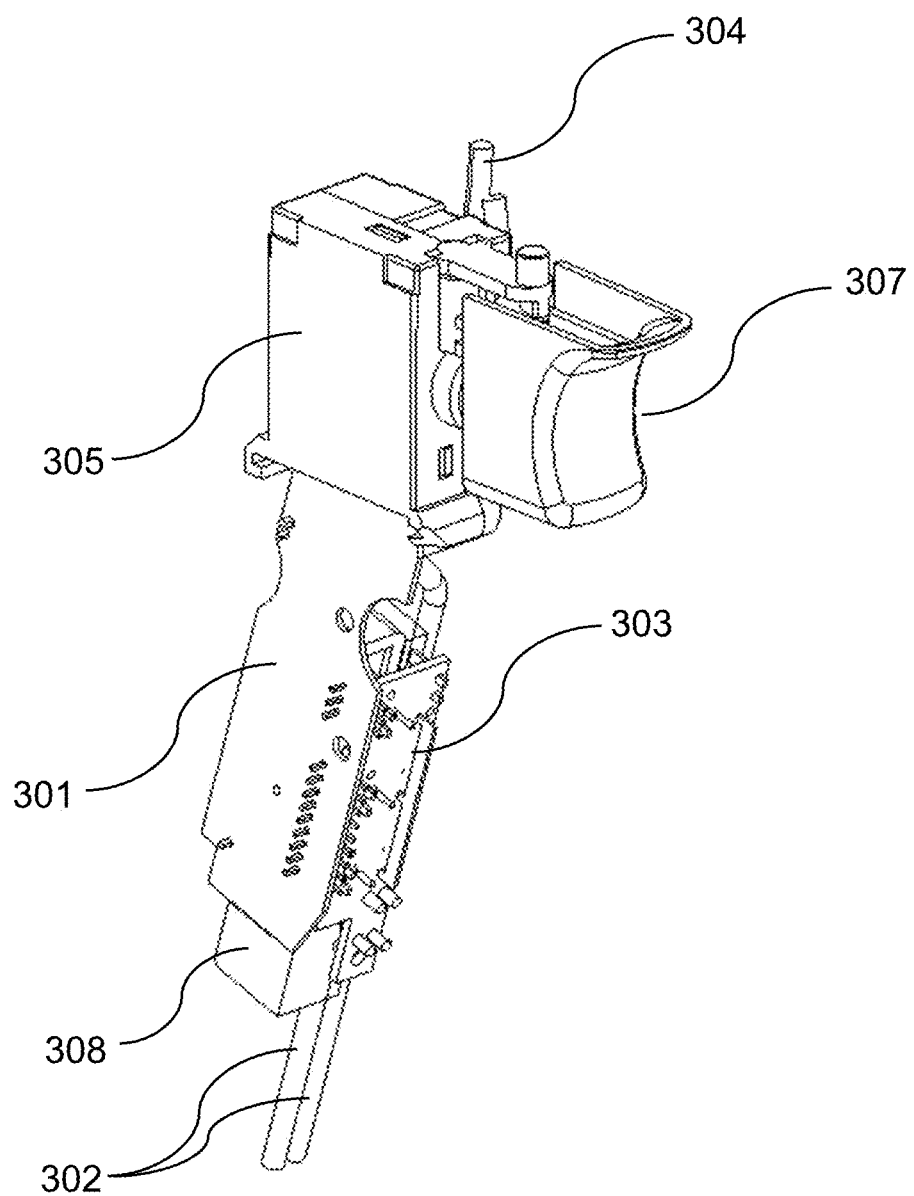
FIG. 9 shows a perspective view of the second embodiment electrical switch unit.
Figure 10:
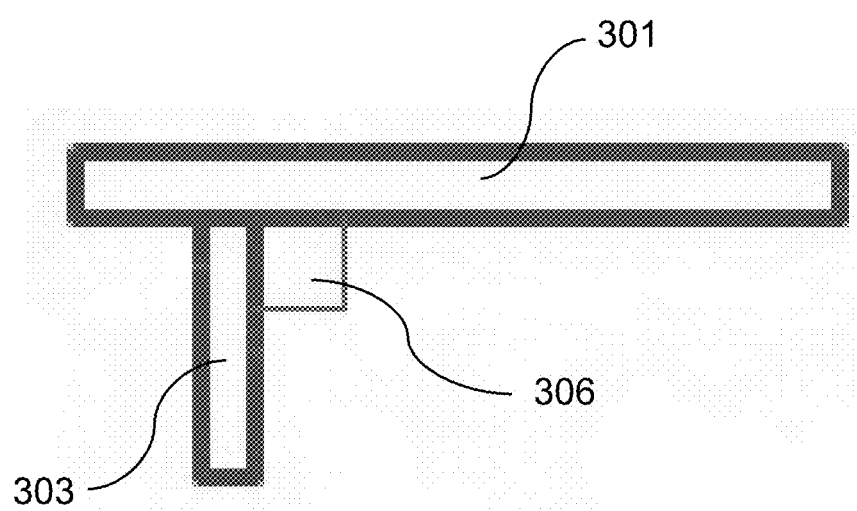
FIG. 10 shows a simplified representation of the integrated signaling module/control module PCB for controlling operation of a DC brushless motor of an electrical power tool mounted perpendicular to the power module PCB, in accordance with the second embodiment of the present invention.

Preferred embodiments of the present invention will now be described herein with reference to FIGS. 1 to 13. Embodiments of the present invention are described herein for use in relation to an electric power tool which may include for instance an electric drill, grinder, sander, saw, rotary driving tool and the like. It would be appreciated and understood that whilst this embodiment is described for use in relation to an electric power tool, this is merely for ease of illustrating functionality and alternate embodiments of the present invention may of course be used in any other type of electric devices such as gardening tools and the like. It would also be appreciated that whilst the electric power tool embodiment described herein relates to a variable speed power tool for illustrative purposes, alternate embodiments of the present invention may also be applicable for use in relation to electric power tools that are non-variable in speed.

The electric power tool includes a brushless DC motor comprising a rotor and a stator for supplying a magnetic field that drives the rotor. The rotor of the brushless DC motor includes an output shaft supported by a number of bearings for providing output torque and is surrounded by a permanent magnet that generates a magnetic field. The stator is mounted around the rotor with an air-gap being disposed therebetween. Stator windings are located in the air-gap arranged relatively parallel with the rotor output shaft and may typically be connected in either of a Delta configuration or a three-phase wye wiring configuration. When current flows through a stator winding, the resulting current in the stator winding generates a magnetic field that magnetically couples with the rotor and which "drags" the rotor around with it. The magnetic field generated by the permanent magnet in the rotor assembly will tend to align itself with the magnetic field generated by the stator such that the rotor will undergo rotational movement. Accordingly, by controlling the timing and sequential energisation of the stator windings, this enables control of rotational movement of the rotor shaft to be set at any desired speed and direction of operation as will be described in greater detail below.

FIGS. 1-5 and 6-10 depict first and second embodiments of the present invention respectively. Each of the embodiments include an electrical switch unit comprising a pair of electrical switching contacts and a variable-speed trigger mechanism (207,307). A moulded plastic housing (205,305) is mounted on the body of the electric power tool near to a handle of the electric power tool which encloses the electrical switching contacts and parts of the variable-speed trigger mechanism. The electrical switching contacts are arranged in series in an electrical circuit between the brushless DC motor and a DC power source (e.g. a battery pack) of the electric power tool. The variable-speed trigger mechanism (207,307) includes a finger-operable trigger (207,307) having an actuator operably connected to the pair of electrical switching contacts. Squeezing of the variable-speed trigger by the user's finger causes the actuator to move relatively inwardly of an opening in the housing (205,305) along a movement axis (X-X') from an OFF position towards an ON position. When the user's finger releases the trigger (207,307), a return spring urges the actuator relatively outwardly of the opening in the housing (205,305) along the movement axis (X-X') from the ON position toward the OFF position by the return spring. The actuator is operably connected to the electrical switch contacts (101) such that in response to the actuator being moved into the ON position, the electrical switching contacts (101) form a closed-circuit arrangement whereby power from the DC power source can be supplied to the brushless DC motor via the pair of electrical switching contacts. Conversely, in response to the actuator being urged back in to the OFF position, the pair of electrical switching contacts are arranged in to an opened-circuit configuration whereby the DC power source is not able to supply power to the brushless DC motor via the pair of electrical switching contacts.

The variable-speed trigger actuator (207,307) is movable through a range of positions along the movement axis (X-X') depending upon the amount of force applied to the trigger (207,307) by the user's finger and the DC motor is configured to operate at variable speeds of operation depending upon the linear movement of the actuator along the movement axis (X-X'). Specifically, the variable-speed trigger mechanism (207,307) is interfaced with a signaling module disposed in the housing (205,305) comprising signaling circuitry for sensing the linear movement of the actuator relative to a reference position and outputting a signaling module signal indicative of the sensed movement or position of the actuator and hence a speed of operation of the motor that is desired by the user. The signaling module (102) circuitry is at least partially formed on a signaling module PCB and includes a potentiometer for sensing the position of the actuator. For instance, a conductive wiper of the potentiometer may be mounted to the actuator to move with the actuator linearly along the movement axis (X-X') relative to corresponding conductive pads of the potentiometer mounted on the signaling module (102) PCB in the electrical switch unit housing. The conductive wiper has an electrical current running therethrough such that the potentiometer will output a variable voltage (i.e. the signaling module signal) depending upon the position of contact of the conductive wiper relative to the conductive pads. The movement of the conductive wiper relative to the conductive pads gradually reduces the resistance of the potentiometer from a relative high resistance towards a relatively low resistance, and the variable voltage signal will vary accordingly.

A power module (203,303) is provided which includes a plurality of power switching devices which in this embodiment are MOSFETs that are each connected in series with a corresponding stator winding of the brushless DC motor (105) via motor cables (204,304). The MOSFETs are configured to enable current flow to be selectively and controllably applied to the inputs of the corresponding stator windings of the brushless DC motor (105). By sequentially activating the individual stator windings in accordance with controlled timing and sequence by reference to the control module (102), the permanent magnet of the rotor continuously follows the advancing magnetic field generated by the stator windings.

A control module (201,301) comprising motor control circuitry receives the signaling module signal from the signaling module, and in response to the received signaling module signal, outputs an electrical control module signal which drives operation of the power module (203,303) comprising a plurality of MOSFETs interfaced with corresponding input terminals of the stator windings of the DC brushless motor. The control module (201,301) includes a microcontroller that is programmed to output the control module signals which drive the plurality of MOSFETs of the power module to energise their corresponding stator windings in accordance with a predetermined timing and sequence so that the brushless DC motor operates in a predetermined manner (i.e. speed, direction, torque) corresponding to the actuator movement indicated by the signaling module signal. The speed and torque of the DC brushless motor is dependent upon the amount of power that can be supplied to the stator windings via their corresponding input MOSFETs. In these embodiments, the amount of power supplied to the stator windings can be controllably varied by use of pulse width modulation techniques whereby the output of a timing signal generator (e.g. a "555" circuit) is used as an input to gates of the MOSFETs to suitably effect high speed switching of the MOSFETs whereby the resulting power switched through the MOSFETs to the stator windings provides the desired amount of speed and torque produced by the DC brushless motor. The timing signal generator signal may therefore serve as the control module signal for controlling operation of the MOSFETs. In certain embodiments, the control module (201,301) may also include voltage regulation and protection circuitry to regulate the input voltage from the DC power source to each of the MOSFETs.

In a conventional power tool configuration, the electrical switching contacts/signaling module of the electrical switch unit and the control module (201,301) are physically separate and spaced-apart electrical units that are electrically connected via a series of insulated conductive wires extending along a length of the body of the electrical power tool. This necessitates soldering of one end of the insulative wiring to the electrical switching contacts and the other end of the insulative wiring to the control module and (201,301)/or power module (203,303). This not only results in additional assembly time, cost, and complexity, but also, the spacing apart of the control module from the electrical switching contacts/signaling module occupies a greater amount of space within the body of the electrical power tool.

Moreover, if the soldering points of the insulative wiring fails, proper operation of the electric power tool may be compromised. Conveniently, in embodiments of the present invention, a novel configuration is provided whereby the control module (201,301) is integrally electrically formed together with the electrical switching contacts and/or signaling module so as to allow for relatively direct electrical communication between the electrical switching contacts and/or signaling module with the control module (201,301). In this regard, the control module (201,301) and the signaling module may typically be formed on a single PCB and by virtue of the direct electrical connection that may be integrally formed in the PCB itself, additional external insulative wiring is now obviated which alleviates the problems described above associated with convention type design configurations. In these embodiments, the electrical connections between the electrical switching contacts/signaling module and the control module (201,301) are provided by electrical conductive pins, conductive pathways, conductive buses and the like that may already be integrally embedded in the signaling module and control module PCB (201,301) itself. However, it would be understood by a person skilled in the art that although in these embodiments the signaling module and the control module (201,301) may be formed on a single physical PCB (or any other suitable electrical circuit substrate technology) they need not necessarily be formed on a single physically PCB and may be formed on physically separate PCBs which are suitably arranged relative to each other to allow relatively direct and integrated electrical connection between the control module and the electrical switching contacts and/or signaling module as described above without the need for additional external insulative wiring therebetween.

In certain embodiments of the present invention, the signaling module and control module (201,301) are integrally formed on a single first PCB whilst the power module (203,303) is formed on a physically separate second PCB (203,303). The first PCB and the second PCB may be mounted relative to each other in either of a parallel spaced-apart configuration using PCB connector members (206, 306) as shown in the embodiment depicted in FIGS. 1-5, or, in a relatively perpendicular configuration by PCB connector members (206,306) as shown in the embodiment depicted in FIGS. 6-10. Advantageously, in each such configuration, thermal energy from the MOSFETs mounted on the power module (203,303) are able to be spaced-apart from the control module (201,301) and the signaling module PCB(s) so as to alleviate potential thermal damage being caused thereto. Where the MOSFETs are surface-mounted-device (SMD) type devices, it would be preferable to utilize the relatively perpendicular configuration between the power module (203,303) and the control module (201,301) and signaling module to better accommodate the geometry of the MOSFET devices. In certain embodiments, if the electrical power tool is of a type which may typically undergo high vibration in use, then a resin material may be used to encapsulate the signaling module, control module, and/or power module, for instance, in a potting boat, to dampen the vibratory effects and thus alleviate damage to these component parts.

Figure 11A:
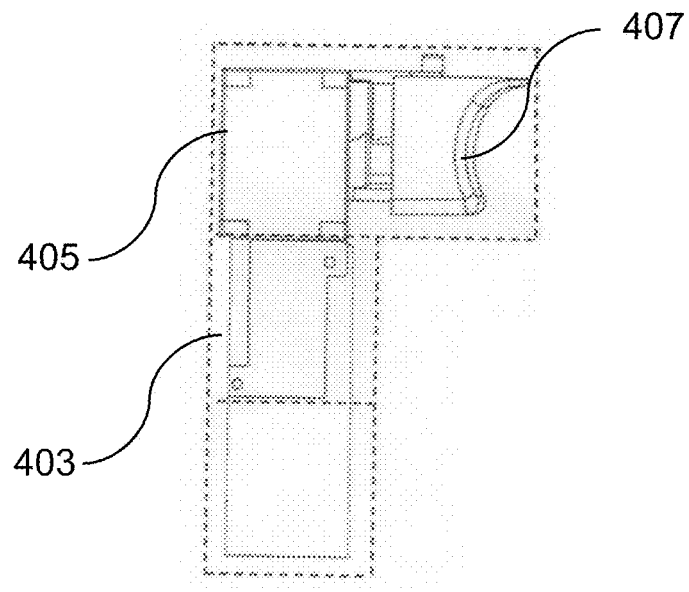
FIGS. 11A and 11B shows front views of an electrical switch unit with a single integrated signaling module, control module and power module PCB for controlling operation of a DC brushless motor of an electrical power tool, in accordance with a third embodiment of the present invention.
Figure 11B:
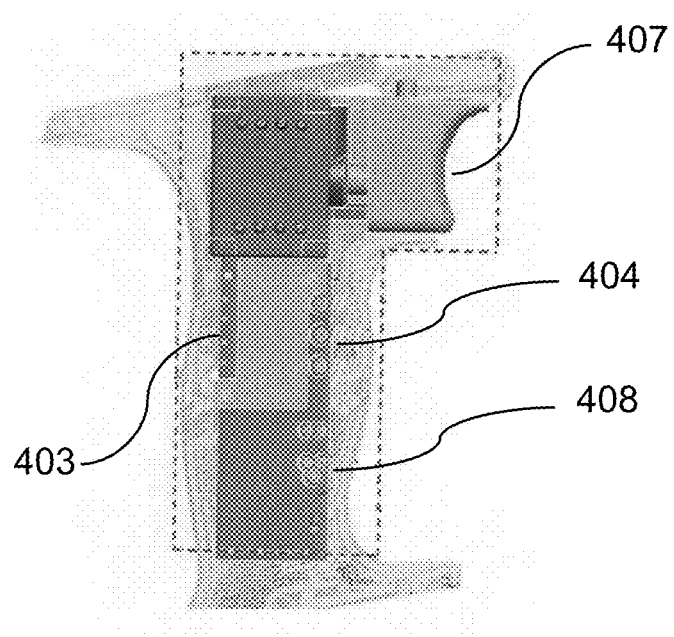
Figure 12:
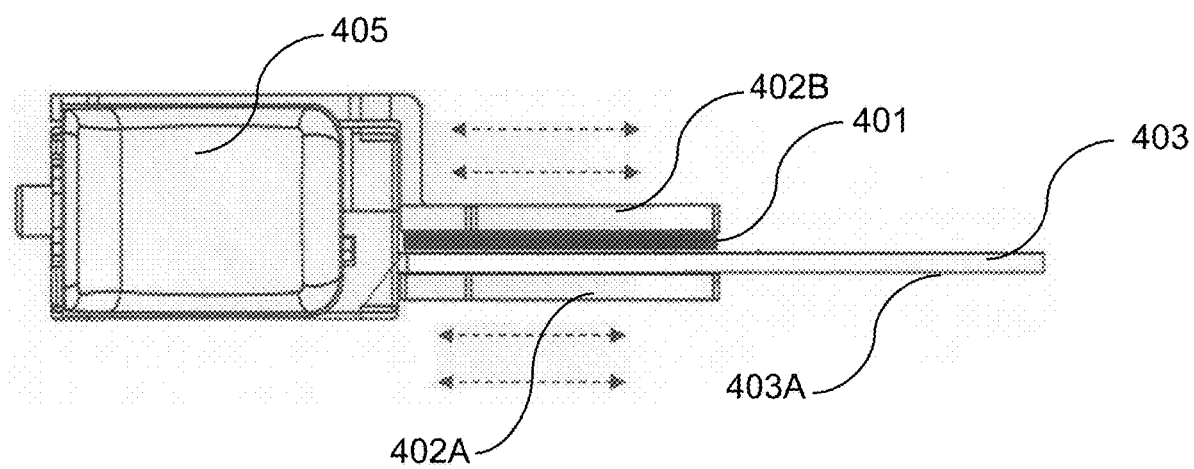
FIG. 12 shows a side view of the electrical switch unit of the third embodiment in which the single integrated signaling module, control module, and power module PCB includes a novel two-sided heat dispersion element mounted on a bottom surface of the PCB and a top surface of the PCB to maximise heat dispersion from the PCB.

As the MOSFETs disposed on the power module will tend to generate a relatively large amount of thermal energy, one or more thermal dispersion and/or dissipation elements such as a heat sink (208,308) are mounted to a lower surface of the power module PCB to enable dispersion and/or dissipation of thermal energy from the MOSFETs in to the surrounding ambient air. Due to the limitations on the amount of thermal energy that can be dissipated and/or dispersed using conventional design configuration, the power module is conventionally formed on a physically separate PCB as outlined above. However, in certain embodiments, such as depicted in FIGS. 11A, 11B and 12, it may be feasible to also allow the power module to be integrally formed on a single PCB (403) together with both the control module and the signaling module of the electrical switch unit by utilising a novel two-sided heat dispersion configuration on the power module PCB. The single integrated PCB (403) further includes a set of motor cables (404) and set of battery cables (408) extending from it. This novel configuration is more clearly depicted in FIG. 12 whereby it can be seen that a first heat dispersion element (402A) is mounted on the bottom surface (403A) of an integrated power module, control module and signaling module PCB (403) together with a second heat dispersion element (402B) mounted directly on to top surfaces of the MOSFETs (401) of the power module so that the amount of thermal energy dispersed is enhanced. The second thermal dispersion element (402B) may be mounted to the top surfaces of the MOSFETs (401) by any suitable mounting techniques which enable suitably effective contact therebetween for thermal communication. By virtue of this enhanced thermal dispersion capability, it is not only more feasible to allow the power module to now be integrally formed together with the signaling module and control module on a single physical PCB to form a relatively compact arrangement, but also, the power rating of the MOSFETs that are used in the power module may potentially be increased so as to improve the output torque of the brushless DC motor. Due to the typically irregular surface of topology of the power module MOSFETs and other components, a thermal heat pad, thermal paste or thermal compound may be utilized as an intermediary thermal transfer layer between the surface of the MOSFETs and a heat sink element or the like to enable more effective thermal communication with the MOSFETs.

Figure 13:
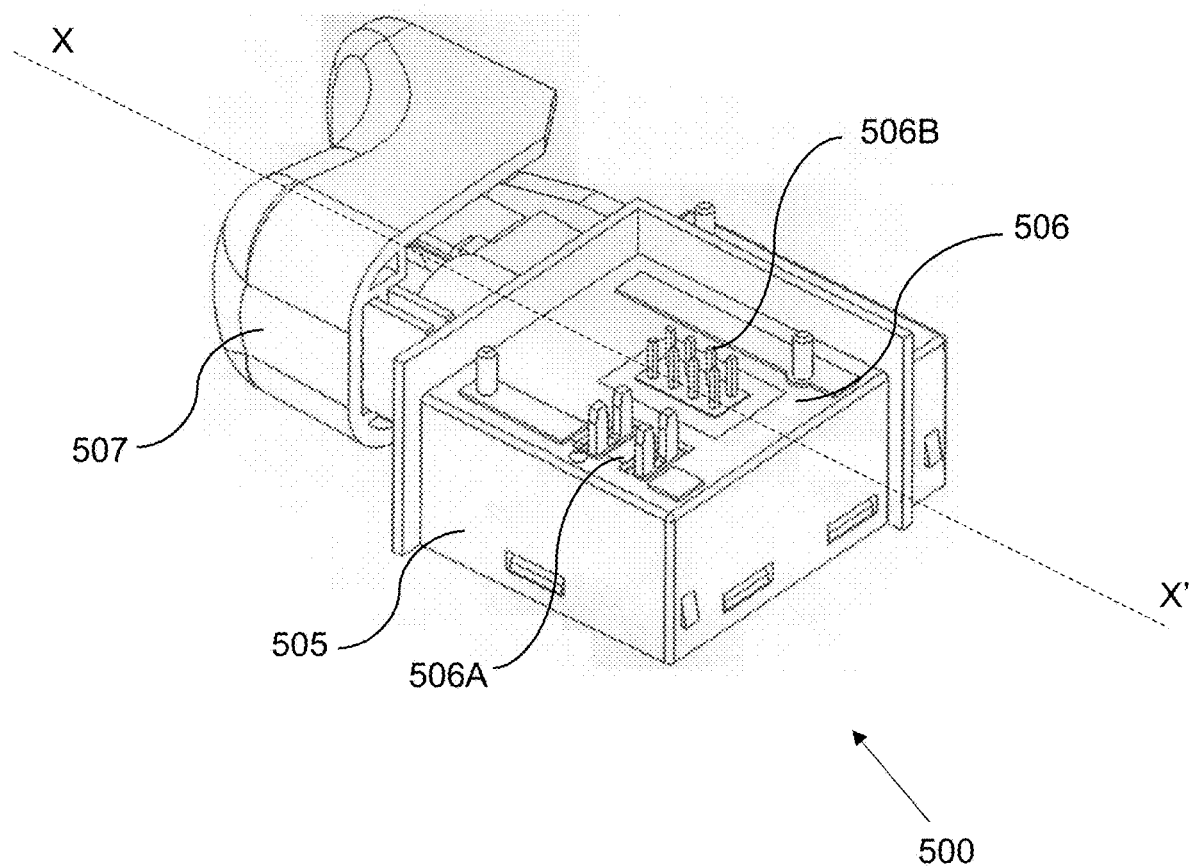
FIG. 13 shows a perspective view of a fourth embodiment of the present invention comprising a customisable electrical switch unit having an electrical connector interface to allow selectable interconnection of customer programmed power module and control module PCB(s) to the electrical switch unit to operate in accordance with specific user requirement.

A further embodiment of the present invention is depicted in FIG. 13 in the form of a customisable electrical switch unit (500) for use with an electrical device to control operation of a brushless DC motor of the electrical device. The customisable electrical switch unit (500) comprises a pair of electrical switching contacts, and, variable trigger assembly (507) having an actuator operably connected with at least one of the pair of electrical switching contacts. A moulded plastic housing (505) is configured for mounted on the body of the electric power tool near to a handle of the electric power tool which encloses the electrical switching contacts and parts of the variable-speed trigger mechanism (507). The electrical switching contacts are configured for arrangement in series in an electrical circuit of the electrical power tool between a brushless DC motor and a DC power source of the electric power tool. The variable-speed trigger mechanism (507) includes a finger-operable trigger (507) having an actuator operably connected to the electrical switching contacts. Squeezing of the variable-speed trigger by the user's finger causes the actuator to move relatively inwardly of an opening in the housing along a movement axis from an OFF position towards an ON position. When the user's finger releases the trigger (507), a return spring urges the actuator relatively outwardly of the opening in the housing (505) along the movement axis (X-X') from the ON position toward the default OFF position by the return spring. The actuator is operably connected to the electrical switch contacts such that in response to the actuator being moved into the ON position, the electrical switching contacts form a closed-circuit arrangement whereby power from the DC power source can be supplied to the brushless DC motor via the pair of electrical switching contacts. Conversely, in response to the actuator being urged back in to the OFF position, the pair of electrical switching contacts are arranged in to an opened-circuit configuration whereby the DC power source is not able to supply power to the brushless DC motor via the pair of electrical switching contacts.

The variable-speed trigger actuator is movable through a range of positions along the movement axis (X-X') depending upon the amount of force applied to the trigger (507) by the user's finger and the motor is configured to operate at variable speeds of operation depending upon the linear movement of the actuator along the movement axis (X-X'). Specifically, the variable-speed trigger mechanism (507) is interfaced with a signaling module comprising signaling circuitry for sensing the linear movement of the actuator relative to a reference position and outputting a signaling module signal indicative of the sensed movement or position of the actuator and hence a speed of the motor that is desired by the user. The signaling module circuitry is at least partially formed on a signaling module PCB and includes a potentiometer for sensing the position of the actuator. For instance, a conductive wiper of the potentiometer may be mounted to the actuator to move with the actuator linearly along the movement axis relative to corresponding conductive pads of the potentiometer mounted on the signaling module PCB in the electrical switch unit housing. The conductive wiper has an electrical current running therethrough such that the potentiometer will output a variable voltage (i.e. the signaling module signal) depending upon the position of contact of the conductive wiper relative to the conductive pads. The movement of the conductive wiper relative to the conductive pads gradually reduces the resistance of the potentiometer from a relative high resistance towards a relatively low resistance, and the variable voltage signal will vary accordingly.

In this embodiment, and an electrical connection interface (506) is also provided via which at least one of an external control module and an external power module are able to be selectably connected to the electrical connector interface (506) of the electrical switch unit to enable customised operation of the electrical switch unit to effect different user-specified operational settings. The power module comprises a plurality of MOSFETs for controllably supplying power from the DC power source to the DC motor and the control module comprises control circuitry for receiving the signaling module signal, and responsive to the received signaling module signal, outputting a control module signal to control the plurality of MOSFETs of the power module. As can be seen from FIG. 13, the electrical connection interface (506) provides a first set of contact pins (506A) for interfacing the electrical switch unit with the external power module PCB and a second set of contact pins (506B) for interfacing the electrical switch unit with the external control module PCB (or single physical PCB comprising both the control module and power module). Conveniently, this customisable electrical switch unit embodiment may for instance allow for a basic electrical switch unit to be produced by OEM manufacturers and shipped to customers for final customised assembly using pre-configured power modules and/or control modules PCB(s) to control operation of electrical power tools according to the customer specific operational requirements. Moreover, as the external power module and control module PCB(s) could be wave soldered to the first and second sets of contact pins respectively for speed and ease of final customised bulk assembly. Conveniently, the electrical connection interface also enables the electrical switching contacts and signaling module to be integrally formed together with the power module and control module for relatively direct electrical connection thus providing similar advantages as outlined above in respect of the other embodiments.

It will be apparent from the preceding embodiments that various advantages may be provided by embodiments of the present invention involving the use of a double-sided thermal dissipation and/or heat dispersion element on the power module, namely, it allows enhanced thermal energy dissipation and/or heat dispersion from MOSFETs and other electronic components. By virtue of this enhanced thermal dissipation and/or dispersion capability, it is feasible to integrally form the power module with the control module and/or signaling module in a single physical PCB. Moreover, MOSFETs having higher power rating capability may be utilized resulting in increased output torque being produced by the brushless DC motor.

It will be further apparent from the preceding embodiments that various advantages may be provided by embodiments of the present invention involving the use of a customisable electrical switch unit with an electrical connector interface, namely, user-programmed control module and power module PCBs may be selectably connected to the electrical connector interface with ease so as to customise operation of the electrical switch unit. Moreover, when connected, the control module PCB and power module PCB are integrally connected to the electrical switch unit so as to provide advantages as outlined above.

In any one of the embodiments described herein, the signaling module associated with the electric switch may be integrally and directly fabricated with the control module on the PCB, whereby there is no need for soldering of any output pins of the signaling module associated with the electric switch to the control module on the PCB. Thus, for instance, the electric switch contacts may be directly fabricated on the PCB by any known fabrication techniques, or for instance, a conductive pad of the signal module potentiometer may be fabricated directly on to the control module PCB whereby a wiper of the signaling module potentiometer may be configured to slide against a conductive pad of the potentiometer that is fabricated directly on the control module PCB. This provides various advantages, namely, external wiring is no longer required to electrically connect the signaling module associated with the electrical switch unit with a physically separate and spaced-apart control module PCB and this alleviates time, cost, and complexity when assembling an external control module PCB. Furthermore, by eliminating the use of external insulative wiring connecting the signaling module associated with the electrical switch to the control module, this alleviates the need for soldering of the external wiring and thereby increases the overall reliability of operation of the overall device. Yet further, the integral fabrication of the signaling module associated with the electrical switch unit with the control module allows for a more compact electric power tool design.

Furthermore, in any one of the embodiments described herein, the signaling module associated with the electric switch unit may be integrally fabricated on to a first end of the control module PCB whereby the first end of the control module PCB upon which the signaling module is integrally fabricated is located within a housing of the electric switch unit (e.g. such as the electric switch housing (403) shown in FIGS. 11A, 11B and 12), and, whereby the control module PCB extends outwardly of an aperture in the electric switch housing and terminates at a distal second end of the control module PCB. Advantageously, in this arrangement, the signaling module components which tend to be relatively more sensitive to damage due to contaminants, mechanical stress, thermal stress and the like, is afforded protection by the electric switch housing and this alleviates the need to protect this region of the control module PCB with potting techniques and the like. Furthermore, the region of the control module PCB that extends outside of the electric switch unit housing may be protected by use of a secondary housing within the electric power tools handle, or, by encapsulating this region of the control module PCB with resin within a potting boat. As the first end of the control module PCB upon which the signaling module is integrally fabricated, and, the region of the control module PCB extending outside of the electric switch housing are configured for protection by separate housing/encapsulation means, this allows for greater convenience and flexibility in fabricating the control module with a range of different electric switch units.

Those skilled in the art will appreciate that the invention described herein is susceptible to variations and modifications other than those specifically described without departing from the scope of the invention. All such variations and modification which become apparent to persons skilled in the art, should be considered to fall within the spirit and scope of the invention as broadly hereinbefore described. It is to be understood that the invention includes all such variations and modifications. The invention also includes all of the steps and features, referred or indicated in the specification, individually or collectively, and any and all combinations of any two or more of said steps or features.

The reference to any prior art in this specification is not, and should not be taken as, an acknowledgment or any form of suggestion that that prior art forms part of the common general knowledge.

What is claimed is:

1. An electrical switch unit for use with a variable speed electrical device to control operation of a DC motor of the electrical device, the electrical switch unit comprising:
    a housing which houses a pair of electrical switching contacts, and, an actuator operably connected with at least one of the pair of electrical switching contacts, the actuator being configured for movement relative to the pair of electrical switching contacts in response to operation of a finger-operable trigger so as to arrange the pair of electrical switching contacts into at least one of a closed configuration wherein power is able to be supplied from a DC power source to the DC motor via the pair of electrical switching contacts, and, an opened configuration wherein power is not able to be supplied from the DC power source to the DC motor via the pair of electrical switching contacts;
    a signaling module associated with the electrical switch unit comprising signaling circuitry for sensing the movement of the actuator and outputting a signaling module signal indicative of the sensed movement or position of the actuator;
    a power module comprising at least one power switching device for controllably supplying power from the DC power source to the DC motor; and
    a control module comprising control circuitry for receiving the signaling module signal, and responsive to the received signaling module signal, outputting a control module signal to control the at least one power switching device of the power module wherein the at least one power switching device controllably supplies power from the DC power source to the DC motor to allow operation of the DC motor at a speed corresponding to the sensed movement or position of the actuator;
    wherein, the at least one of the pair of electrical switching contacts, the signaling module, the control module and the power module are integrally formed together in a single PCB, said PCB including at least one of electrical conductive pins, conductive pathways, and conductive buses integrally embedded in the PCB via which the at least one of the pair of electrical switching contacts, the signaling module, the control module and the power module are in electrical communication, and the control module is configured to extend outwardly of the housing so as to terminate at a distal end of the control module.

2. An electrical switch unit as claimed in claim 1 wherein the DC motor is a brushless DC motor.

3. The electrical switch unit of claim 2 wherein the at least one power switching device includes a MOSFET device.

4. The electrical switch unit of claim 1 wherein the at least one power switching device includes a MOSFET device.

5. An electrical switch unit as claimed in claim 1 including a protective resin coating for protecting components of at least one of the signaling module, the control module and the power module.

6. An electrical switch unit as claimed in claim 1 including a heat dissipation and/or heat dispersion element arranged in thermal communication with a bottom region of the power module to allow heat dissipation from the power module.

7. An electrical switch unit as claimed in claim 1 including a first and second heat dissipation and/or heat dispersion element arranged in thermal communication with a bottom region and a top region of the power module respectively to allow heat transfer from the power module.

8. An electrical device comprising an electrical switch unit in accordance with claim 1.

9. An electrical device as claimed in claim 8 wherein the electrical device includes at least one of an electrical power tool and an electrical gardening tool.

10. A customisable electrical switch unit for use with a variable speed electrical device to control operation of a DC motor of the electrical device, the electrical switch unit comprising:
    a housing which houses a pair of electrical switching contacts, and, an actuator operably connected with at least one of the pair of electrical switching contacts, the actuator being configured for movement relative to the pair of electrical switching contacts in response to operation of a finger-operable trigger so as to arrange the pair of electrical switching contacts into at least one of a closed configuration wherein power is able to be supplied from a DC power source to the DC motor via the pair of electrical switching contacts, and, an opened configuration wherein power is not able to be supplied from the DC power source to the DC motor via the pair of electrical switching contacts;
    a signaling module associated with the electrical switch unit comprising signaling circuitry for sensing the movement of the actuator and outputting a signaling module signal indicative of the sensed movement or position of the actuator;
    a power module comprising at least one power switching device for controllably supplying power from the DC power source to the DC motor;
    a control module comprising control circuitry for receiving the signaling module signal, and responsive to the received signaling module signal, outputting a control module signal to control the at least one power switching device of the power module wherein the at least one power switching device controllably supplies power from the DC power source to the DC motor to allow operation of the DC motor at a speed corresponding to the sensed movement or position of the actuator; and an electrical connector interface having a plurality of connector pins via which the power module and the control module are able to be directly electrically connectable to a single PCB, said single PCB including at least one of the pair of electrical switching contacts and the signaling module integrally formed therein, and whereby said single PCB includes at least one of electrical conductive pins, conductive pathways, and conductive buses integrally embedded therein via which the at least one of the pair of electrical switching contacts, the signaling module, the control module and the power module are in electrical communication.

11. An electrical switch unit as claimed in claim 10 wherein the DC motor includes a brushless DC motor.

12. An electrical switch unit as claimed in claim 10 wherein the at least one power switching device includes a MOSFET device.

13. An electrical switch unit as claimed in claim 10 including a protective resin coating for protecting components of at least one of the signaling module, the control module and the power module.

14. An electrical switch unit as claimed in claim 10 including a heat dissipation and/or heat dispersion element arranged in thermal communication with a bottom region of the power module to allow heat dissipation from the power module.

15. An electrical switch unit as claimed in claim 10 including a first and second heat dissipation and/or heat dispersion element arranged in thermal communication with a bottom region and a top region of the power module respectively to allow heat transfer from the power module.

* * * * *